United States Patent [19]
Kim et al.

[11] Patent Number: 6,069,073
[45] Date of Patent: May 30, 2000

[54] METHOD FOR FORMING DIFFUSION BARRIER LAYERS

[75] Inventors: Youn Tae Kim; Chi Hoon Jun; Jong Tae Baek, all of Daejeon, Rep. of Korea

[73] Assignee: Electronics and Telecommunications Research Institute, Daejon, Rep. of Korea

[21] Appl. No.: 09/126,094

[22] Filed: Jul. 30, 1998

[30] Foreign Application Priority Data

Sep. 18, 1997 [KR] Rep. of Korea ............. 97-47574

[51] Int. Cl.$^7$ ..................................... H01L 21/28
[52] U.S. Cl. ........................ 438/643; 438/627; 438/653
[58] Field of Search .................... 438/643, 627, 438/653, 648–649, 650–651, 654–656, 682–683

[56] References Cited

U.S. PATENT DOCUMENTS

| | | | |
|---|---|---|---|
| 5,440,174 | 8/1995 | Nishitsuji | 257/770 |
| 5,776,823 | 7/1998 | Agnello et al. | 438/592 |
| 5,903,053 | 5/1999 | Iijima et al. | 257/751 |
| 5,907,188 | 5/1999 | Nakajima et al. | 438/653 |

FOREIGN PATENT DOCUMENTS

| | | |
|---|---|---|
| 0514103A1 | 11/1992 | European Pat. Off. . |
| 0545602A1 | 6/1993 | European Pat. Off. . |

OTHER PUBLICATIONS

Tadashi Iijima et al., "Inlai$_d$ Cu Interconnects Employing Ti–Si–N Barrier Metal for ULSI Applications", IEICE Trans. Electron, vol. E79–C, No. 4, Apr. 1996, pp. 568–572.

J. S. Reid et al., "Evaluation of amorphous (Mo, Ta, W)–Si–N diffusion barriers for <Si>|Cu metallizations", 1993–Elsevier Sequoia, pp. 319–324.

E. Kolawa et al., "Sputtered Ta–Si–N Diffusion Barriers in Cu Metallizations for Si", IEEE Electron Device Letters, vol. 12, No. 6, Jun. 1991, pp. 321–323.

J. S. Reid et al., "Ti–Si–N Diffusion Barriers Between Silicon and Copper", IEEE Electron Device Letters, vol. 15, No. 8, Aug. 1994, pp. 298–300.

*Primary Examiner*—Chandra Chaudhari
*Assistant Examiner*—Thanh Nguyen
*Attorney, Agent, or Firm*—Jacobson, Price, Holman & Stern, PLLC

[57] ABSTRACT

An improved method for forming diffusion barrier layers for sub-micron connects in integrated circuits is disclosed. The dual diffusion barriers is easily formed according to two-step annealing processes. The anneal includes two anneal cycles or steps, each cycle is performed at a separate and distinct temperature cycles. Each cycle is performed in the presence of ammonia (NH3) or nitrogen ambient. As a result of the first low-temperature cycle, a nitridation occurs at the upper surface to form a binary diffusion barrier layer. As a result of the second high-temperature cycle, an out-diffusion of silicon ions occurs at the lower surface to form a ternary alloys. The dual diffusion barriers obtained by a simple and easy two-step anneal processing exhibits an improved barrier performance. Furthermore, it is possible to form highly stable multilevel interconnections without any deterioration problems by reducing the sophisticated processing steps.

6 Claims, 5 Drawing Sheets

METHOD FOR FORMING DIFFUSION BARRIER LAYERS

BACKGROUND OF THE INVENTION

1. Field of the Invention

The present invention relates generally to semiconductor integrated circuit processing, and more specifically to an improved method for forming a diffusion barrier layers for sub-micron connects in integrated circuits.

2. Description of the Prior Art

In silicon integrated circuit technology, an aluminum alloy is most commonly used for the ultra large scale integrated (ULSI) metallization. However, as device dimensions approach the deep submicron regime, several problems arise. Higher speed and higher electromigration reliability are required, and consequently a new metallization material is needed which offers lower resistivity for reduced RC delay and greater resistance to electromigration. Copper could be used in place of aluminum to answer this need.

However, there are several unresolved issues regarding copper metallization. Cu diffuses rapidly in Si and $SiO_2$. In an Si substrate, a deep level that acts as a generation-recombination center is formed as a result of diffusion. This causes degradation of junction leakage characteristics.

In order to overcome these problems, researchers have begun to focus upon using what is often called "diffusion barriers". A diffusion barrier is defined as part of the metallization scheme, and comprises a layer of material interposed between an overlying conductor such as copper (Cu) and an underlying contact region such as doped silicon (Si) or silicon dioxide. The overall structure is therefore a multilayer structure. The role of a diffusion barrier is to prevent or at least retard interdiffusion of material on opposite sides of the barrier into one another.

An amorphous alloys with high crystallization temperature and with no grain boundaries are appealing candidates for diffusion barriers because they lack grain boundaries that can act as diffusion paths. For example, amorphous binary silicides, such as (Mo, Ta or W)—Si, and amorphous ternary alloys, such as (Mo, Ta, W or Ti)—Si—N have been disclosed as amorphous diffusion barriers. These amorphous ternary metallic alloys have shown superior barrier properties partly due to their lack of fast diffusion paths.

However, formation of these amorphous ternary alloys involves sophisticated sputtering processes using a transition metal alloy targets with quite uniform composition. Further, sputter deposited ternary alloys introduces large quantities of contaminants during the sputter operation.

Generally speaking, sputter-deposited ternary diffusion barrier produces a brittle thin film with poor adhesion to the sputtering system components. A large number of particles are thereby generated during the sputter process using alloy targets which results in a significant increase in deleterious particulate matter deposited upon the wafer.

Thus, what is needed is to develop a simple and easy process together with minimizing problems relevant to the diffusion barrier.

SUMMARY OF THE INVENTION

It is therefore an object of the present invention to provide a method for forming a diffusion barrier which is capable of providing an improved barrier properties effectively.

It is another object of the present invention to provide a method for manufacturing a diffusion barrier having a minimum thickness, and inexpensive and simple to manufacture.

According to a preferred embodiment of this invention, there is provided an improved method for forming a diffusion barrier layers, said method comprising the steps of:

(a) preparing a silicon substrate, (b) depositing a refractory metal on an entire surface of said silicon substrate, (c) annealing the metal-coated silicon substrate using a sequential two-step thermal processing cycle to form a dual diffusion layers, wherein the two-step thermal processing comprises the steps of: (c-1) annealing in a low-temperature range in a nitrogen ambient to minimize metal/silicon interaction while maintaining metal/nitrogen interaction and nitrogen diffusion through the metal layer, thereby forming a binary alloy within a upper portion of said dual diffusion layer; and (c-2) annealing in a high-temperature range in a nitrogen ambient to form a ternary alloy within a lower portion of said dual diffusion layer using an outdiffusion of silicon ions.

Preferably, the low-temperature range of the first annealing is less than 400 degrees celsius, and the high-temperature range of the second annealing is between 450° C. to 700° C.

Other objects, advantages, and novel features, and further scope of applicability of the present invention will be set forth in part in the detailed description to follow, taken in conjunction with the accompanying drawings, and in part will become apparent to those skilled in the art upon examination of the following, or may be learned by practice of the invention.

BRIEF DESCRIPTION OF THE DRAWINGS

The accompanying drawings are only for the purpose of illustrating a preferred embodiment of the invention and are not to be construed as limiting the invention.

DESCRIPTION OF THE PREFERRED EMBODIMENTS

Referring to FIGS. 1A to 1D, forming processes of diffusion barrier layers in accordance with preferred embodiment will be described in detail.

Figure 1A:
FIGS. 1A~1D are process perspective view sequentially showing a forming method of a dual diffusion barrier layers in accordance with the present invention.

Referring to FIG. 1A, a silicon substrate 10 is prepared. All experiments were carried out on (100)-oriented p-type silicon wafers, with a resistivity of 6 to 9 Ωcm. The silicon wafers 10 were cleaned with an aqueous solution of hydrogen fluoride (HF) in order to remove a native oxide, and were rinsed with de-ionized water.

Figure 1B:
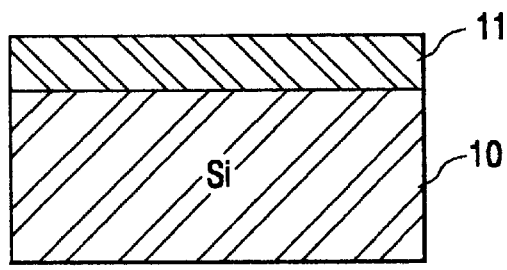

Referring to FIG. 1B, on the entire surface of the p-type silicon wafer 10, a refractory metal 11, such as titanium (Ti), tantalum (Ta) or tungsten (W) is deposited. For example, in this embodiment, all Ti depositions were carried out in physical vapor deposition (PVD) system using 1:1 coherent, 12 kW, 1 mTorr, and 400° C. process conditions for 200 Å thickness. Before the Ti refractory metal 11 deposition, native oxide was removed in the precleaning chamber, and Ti deposition proceeded without a break in vacuum.

The Ti refractory metal 11, of course, can be deposited by sputtering method using a DC magnetron sputter apparatus from a pure or substantially pure Ti single target within an inert ambient, such as Ar.

Figure 1C:
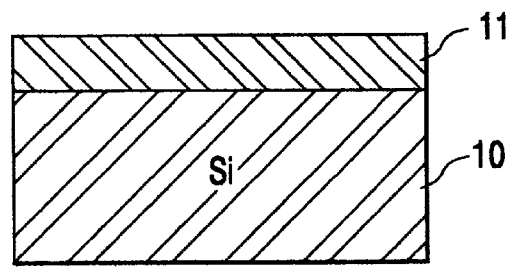
Figure 1D:
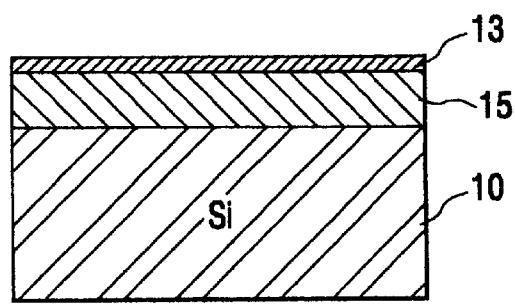

Turning now to FIGS. 1C and 1D, an anneal of the previously deposited Ti layer 11 is shown. The anneal includes two anneal cycles or steps, each cycle is performed at a separate and distinct temperature cycles. Each cycle is performed in the presence of ammonia (NH3) or nitrogen ambient. The nitrogen ambient is used as a nitridation agent. It is also imperative that the amount and timing of nitridation (TiN) at the upper surface of the Ti layer 11 be carefully controlled with respect to the lower surface of layer 11.

Firstly, FIG. 1C illustrates the first temperature cycle in which Ti layer 11 is subjected to nitrogen ambient at a temperature below 400° C. for 90 to 120 seconds. As a result of the first temperature cycle, a nitridation occurs at the upper surface so as to minimize Ti/Si interaction while maintaining Ti/nitrogen interaction and nitrogen diffusion through the Ti layer 11. Therefore, a binary diffusion barrier layer 13, such as a TiN layer, is formed at the upper surface of the Ti layer.

FIG. 1D illustrates a second annealing in a high-temperature cycle separate and distinct from the first temperature cycle of FIG. 1C. Specifically, the second annealing occurs after the first annealing is completed. The second annealing takes place at a temperature between 600 to 700 degrees celsius for 60 to 90 seconds. As a result of the second temperature cycle, an out-diffusion of silicon ions occurs at the lower surface to form a ternary alloys, such as Ti—Si—N layer 15.

At this time, since the diffusion speed of the silicon ions within the silicon substrate 10 is much faster than those of the refractory metal and nitrogen, as shown in FIG. 1D, a thickness of the binary diffusion barrier layer at the upper surface, such as TiN layer 13 is thinner than that of the ternary diffusion barrier layer at the lower surface, such as Ti—N—Si layer 15.

Hereinafter, the properties of the dual diffusion barrier layers were analyzed by Rutherford backscattering spectroscopy (RBS) analysis, secondary ion mass spectrometry (SIMS) analysis, and sheet resistance measurement.

Figure 2A:
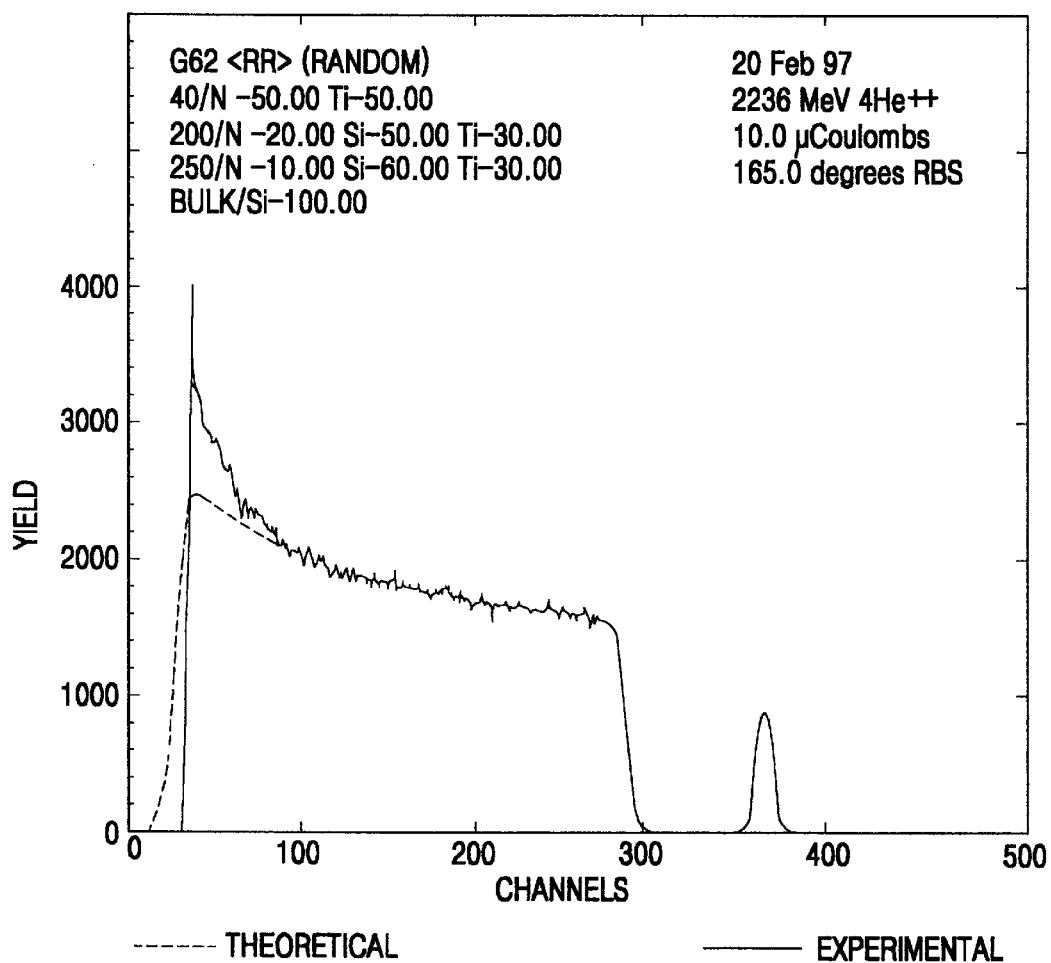
FIGS. 2a and 2b are graphs illustrating a Rutherford backscattering spectroscopy (RBS) spectra of diffusion barrier layers according to this invention.
Figure 2B:
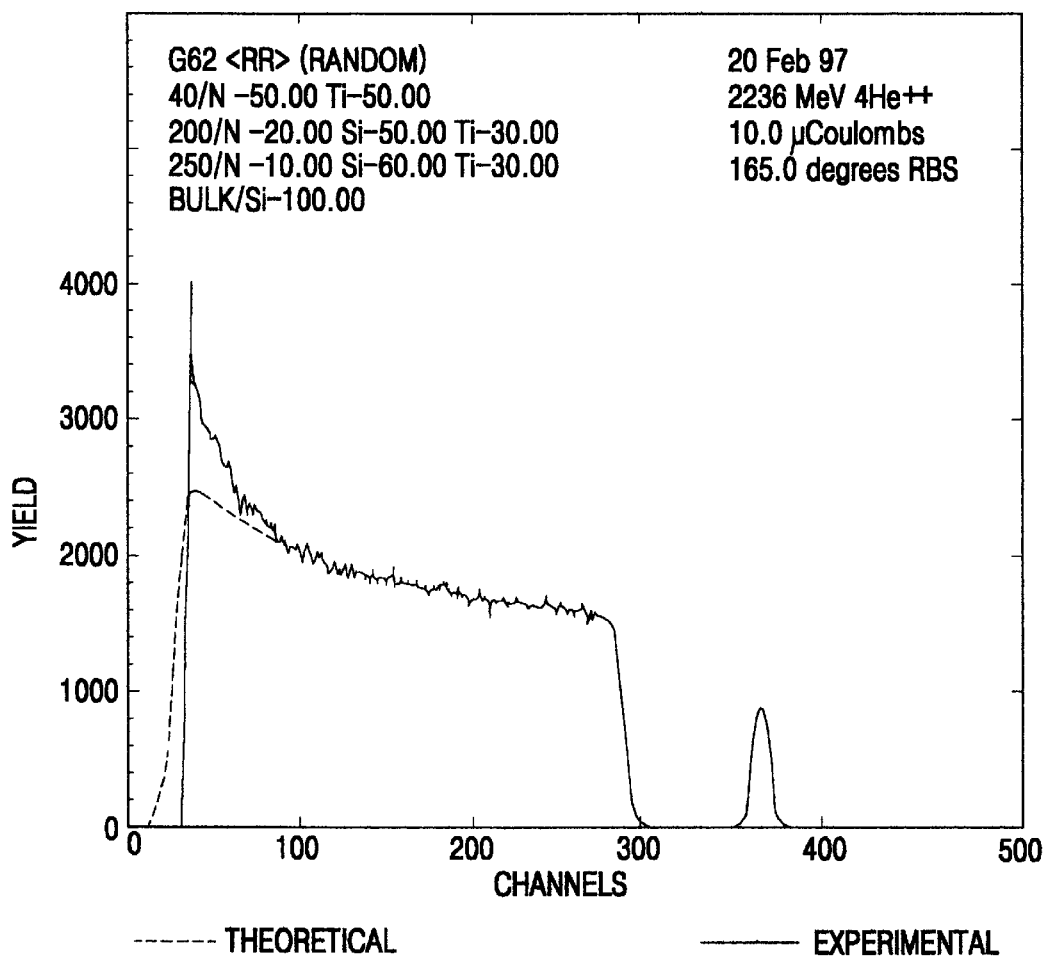

FIGS. 2a and 2b are graphs illustrating a Rutherford backscattering spectroscopy (RBS) spectra of diffusion barrier layers according to this invention. For analyzing the composition and thickness of thermally converted dual diffusion barrier layers, a typical 2.0 MeV He+ ion backscattering spectrum of TiN/TiSiN/Si structures is used in this embodiment. The elements analyzed were titanium, nitrogen, and silicon. Also, the thickness of the deposited Ti layer used in this analysis is about 200 Å.

From RBS analysis, by a first annealing process at 400° C. for 90 seconds and a second annealing process at 700° C. for 90 seconds, a TiN diffusion barrier layer 13 was formed within a depth of about 40 from the surface, as shown in FIG. 2a. It was found that a TiN layer was formed to about 40 Å, and a TiSiN layer was formed to about 160 Å by the two-step process.

Also, by a first annealing process at 400° C. for 120 seconds and a second annealing process at 700° C. for 90 seconds, a TiN diffusion barrier layer was formed within a depth of about 50 Å from the surface, as shown in FIG. 2b.

Figure 3:
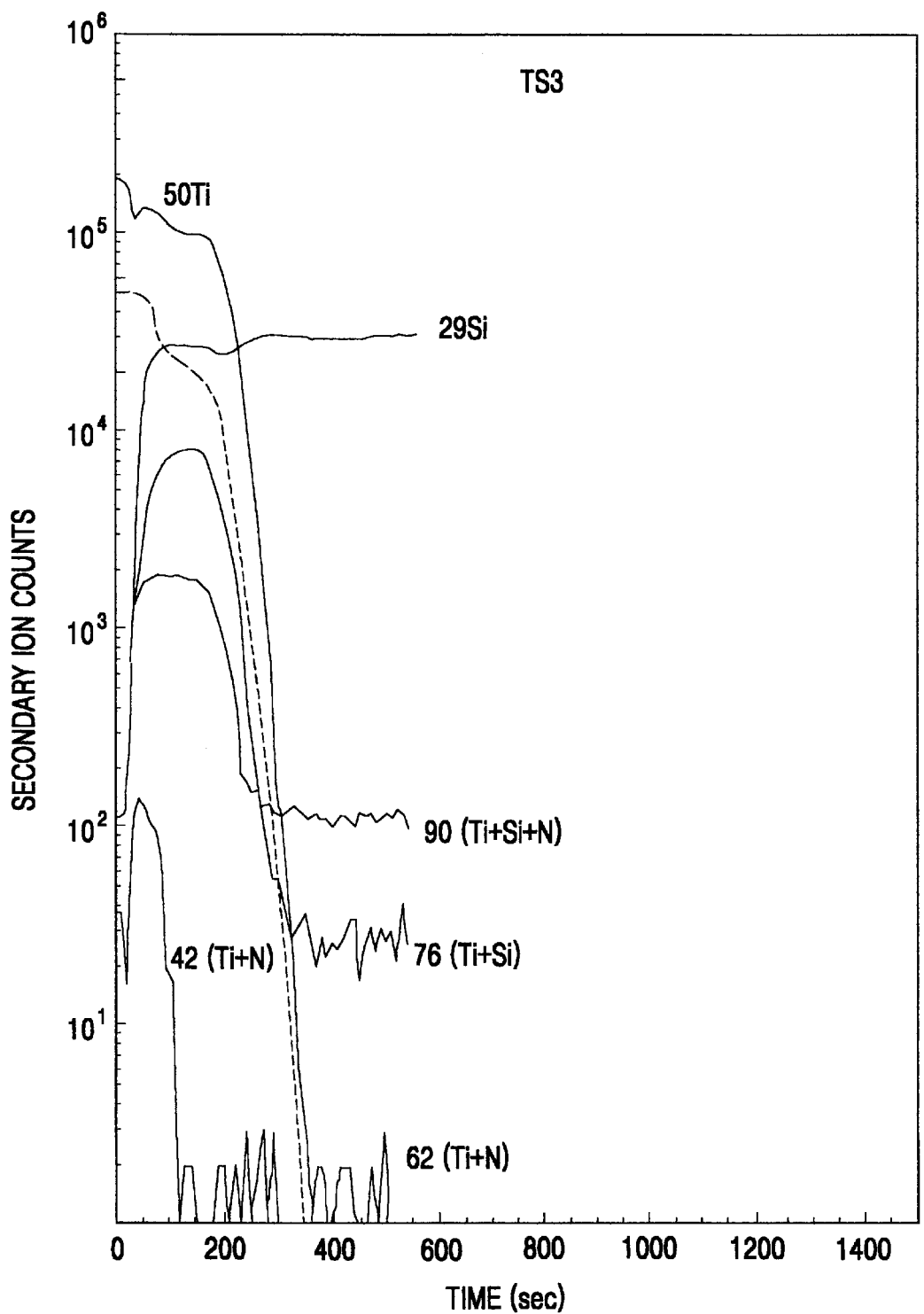
FIG. 3 is a graph illustrating a secondary ion mass spectrometry (SIMS) profiles of diffusion barrier layers according to the present invention.

The above results are agree with a secondary ion mass spectrometry (SIMS) profiles, as shown in FIG. 3.

Figure 4:
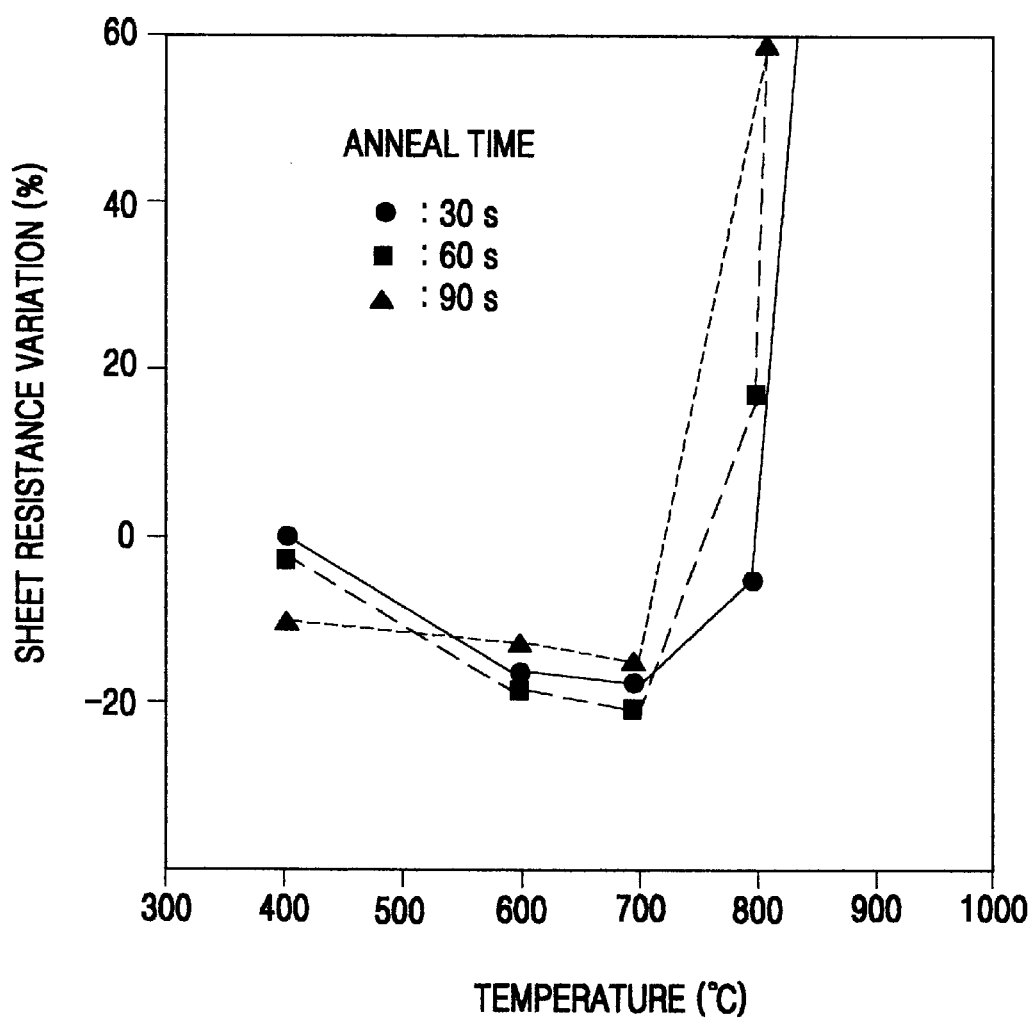
FIG. 4 is a graph showing a sheet resistance variation as a function of annealing temperature.

FIG. 4 shows the sheet resistance variation of MOCVD (Metal Organic Chemical Vapor Deposition)-Cu/TiN/TiSiN structures as a function of annealing temperature to analyze a barrier properties of dual diffusion barriers against Cu films.

As shown in FIG. 4, there was negligible variation in sheet resistance up to 700° C. annealing conditions. This result show that the dual barrier layers have excellent thermal stability as a barrier layer up to 700° C. for Cu metallization. This result means that the first step temperature cycle required to minimize metal/silicon interaction while maintaining nitrogen diffusion through the metal layer lies in the range of 400° C., and the second step temperature is up to 700° C.

According to the present invention as described above, it is found that the dual diffusion barriers made of TiN/TiSiN which is obtained by a simple and easy two-step anneal processing exhibits an improved barrier performance.

Furthermore, it is possible to form highly stable multi-level interconnections without any deterioration problems by reducing the sophisticated processing steps.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method for forming a diffusion barrier layers, said method comprising the steps of:
    a) preparing a silicon substrate;
    b) depositing a refractory metal on an entire surface of said silicon substrate;
    c) annealing a metal-coated silicon substrate using a sequential two-step thermal processing cycle to form a dual diffusion layers, wherein the two-step thermal processing comprises the steps of:
        annealing in a low-temperature range in a nitrogen ambient to minimize metal-silicon interaction while maintaining metal-nitrogen interaction and nitrogen diffusion through the metal layer, thereby forming a binary alloy within an upper portion of said dual diffusion layer; and
        annealing in a high-temperature range in a nitrogen ambient to form a ternary alloy within a lower portion of said dual diffusion layer using an outdiffusion of silicon ions.

2. The method for forming diffusion barrier layers according to claim 1, wherein said low-temperature range is less than 400 degrees celsius.

3. The method for forming diffusion barrier layers according to claim 1, wherein said high-temperature range is between 600° C. to 700° C.

4. The method for forming diffusion barrier layers according to claim 1, wherein said binary alloy is alloys thereof selected from the group consisting of TiN, TaN and WN.

5. The method for forming diffusion barrier layers according to claim 1, wherein said ternary alloy is alloys thereof selected from the group consisting of Ti—Si—N, Ta—Si—N and W—Si—N.

6. The method for forming diffusion barrier layers according to claim 1, wherein a thickness of said binary alloy is thinner than that of the ternary alloy.

* * * * *